(12) United States Patent
Mathew et al.

(10) Patent No.: US 8,003,517 B2
(45) Date of Patent: Aug. 23, 2011

(54) METHOD FOR FORMING INTERCONNECTS FOR 3-D APPLICATIONS

(75) Inventors: Varughese Mathew, Austin, TX (US); Eddie Acosta, Martindale, TX (US); Ritwik Chatterjee, Austin, TX (US); Sam S. Garcia, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 849 days.

(21) Appl. No.: 11/807,777

(22) Filed: May 29, 2007

(65) Prior Publication Data
US 2008/0299762 A1 Dec. 4, 2008

(51) Int. Cl.
*H01L 21/4763* (2006.01)

(52) U.S. Cl. ........ 438/626; 438/627; 438/667; 438/678; 257/E21.586

(58) Field of Classification Search ................ 438/626, 438/627, 667, 675, 678; 257/E21.175, E21.586
See application file for complete search history.

(56) References Cited

U.S. PATENT DOCUMENTS

| | | | |
|---|---|---|---|
| 6,849,173 B1 * | 2/2005 | Chang et al. | 205/118 |
| 6,852,627 B2 | 2/2005 | Sinha et al. | |
| 6,908,856 B2 | 6/2005 | Beyne et al. | |
| 2004/0242010 A1 * | 12/2004 | Deshpande et al. | 438/710 |
| 2005/0064707 A1 * | 3/2005 | Sinha | 438/667 |
| 2005/0186790 A1 * | 8/2005 | Kirby et al. | 438/667 |
| 2006/0043535 A1 * | 3/2006 | Hiatt | 257/621 |
| 2006/0281215 A1 * | 12/2006 | Maruyama et al. | 438/57 |
| 2007/0082474 A1 * | 4/2007 | Shih et al. | 438/597 |
| 2008/0153265 A1 * | 6/2008 | Lyne | 438/465 |

OTHER PUBLICATIONS

Sparks, Terry G. and Jones, Robert E.; "Conductive VIA Formation Utilizing Electroplating"; filed Feb. 27, 2007; U.S. Appl. No. 11/679,512; 17 pages.
Ruythooren, W. et al.; "Via technology for 3D wafer stacking"; IMEC, Belgium 2006; 31 pages.

* cited by examiner

*Primary Examiner* — Tuan N. Quach
(74) *Attorney, Agent, or Firm* — John A. Fortkort; Fortkort & Houston P.C.

(57) ABSTRACT

A method for forming an interconnect, comprising (a) providing a substrate (203) with a via (205) defined therein; (b) forming a seed layer (211) such that a first portion of the seed layer extends over a surface of the via, and a second portion of the seed layer extends over a portion of the substrate; (c) removing the second portion of the seed layer; and (d) depositing a metal (215) over the first portion of the seed layer by an electroless process.

19 Claims, 4 Drawing Sheets

US 8,003,517 B2

METHOD FOR FORMING INTERCONNECTS FOR 3-D APPLICATIONS

FIELD OF THE DISCLOSURE

The present disclosure relates generally to fabrication processes for semiconductor devices, and more particularly to methods for making interconnect vias.

BACKGROUND OF THE DISCLOSURE

As semiconductor processing technology approaches the limits of traditional CMOS scaling, process integration has become increasingly difficult, and has resulted in diminished rates of performance improvement. Consequently, there is currently considerable interest in the art for chip and package stacking solutions, including "system in package" (SiP) and "package on package" (PoP) technologies. Further performance and form factor advantages may be realized through the implementation of 3D integration technologies. Through silicon vias (TSV) are an important key to solutions of this type, since they enable three dimensional stacking and integration of semiconductor devices.

DETAILED DESCRIPTION

In one aspect, a method is provided herein for forming an interconnect. In accordance with the method, a substrate is provided which has a via defined therein. A seed layer is formed such that a first portion of the seed layer extends over a surface of the via, and a second portion of the seed layer extends over a portion of the substrate. The second portion of the seed layer is then removed, and a metal is deposited over the first portion of the seed layer by an electroless process.

Conventional 3D integration processes utilize through-semiconductor vias (TSV) to allow chips to be stacked vertically. Such TSVs are typically filled by an electroplating process. However, electroplating may produce suboptimal results in some applications. For example, when conventional electroplating processes are used for filling deep or wide vias (e.g., vias having depths of at least 50 microns, or having widths of at least 5 microns), voiding frequently occurs, which may adversely affect the physical and electrical properties of the resulting interconnect. Such voiding may arise, for example, from pinch-off or non-uniform wetting. Moreover, when conventional electroplating is used to fill such vias, it frequently results in large overburdens, which may impose stress on, and induce fractures in, a semiconductor substrate. Moreover, the removal of these large overburdens often requires extended chemical mechanical polishing (CMP).

It has now been found that the aforementioned problems may be overcome by using a modified electroless deposition process to fill vias which have been formed in a substrate. In the modified process, the portion of the seed layer extending over the substrate in the area adjacent to the via is removed prior to electroless deposition, as through chemical mechanical polishing (CMP), etching, or by other suitable means. This approach may prevent or minimize the formation of overburden, and is especially useful in filling deep TSVs. This approach may be used to create vias in 3D interconnect applications, interposer solutions, wafer level packaging of MEMS systems, system in package (SiP) applications, package on package (PoP) applications, and the like.

The devices and methodologies disclosed herein may be further understood in the context of the prior art process depicted in FIGS. 1-5. In the methodology depicted therein, a semiconductor structure 101 is provided which comprises a semiconductor wafer 103 having a plurality of vias 105 defined therein. The vias 105 are created with the use of a mask (not shown) which is patterned on the semiconductor wafer 103. After the mask is defined, the vias 105 are etched into the semiconductor wafer 103 with a suitable etchant.

Figure 1:
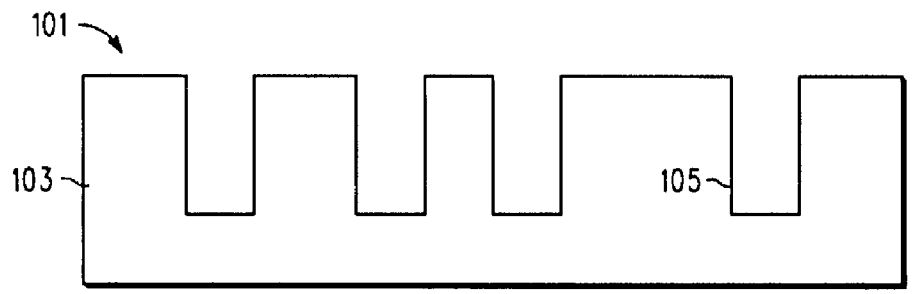
FIG. 1 is an illustration of a step in a prior art process for making a via in a semiconductor layer.
Figure 2:
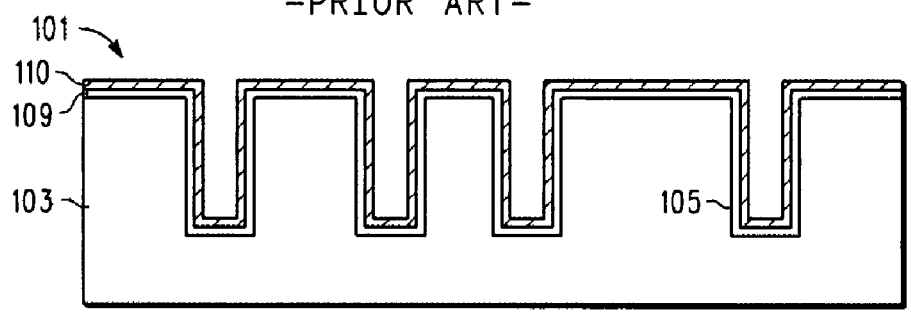
FIG. 2 is an illustration of a step in a prior art process for making a via in a semiconductor layer.

Once the vias 105 are formed and the mask is removed, a dielectric layer 109 is deposited over the structure as shown in FIG. 2 so as to cover the sidewalls and bottom of the vias 105. A barrier layer 110 is then deposited over the dielectric layer 109.

Figure 3:
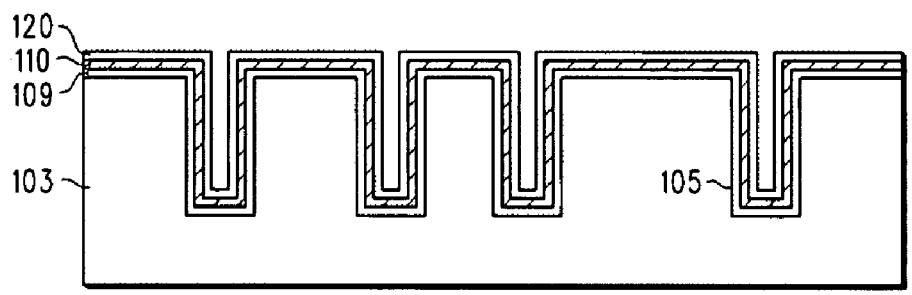
FIG. 3 is an illustration of a step in a prior art process for making a via in a semiconductor layer.
Figure 4:
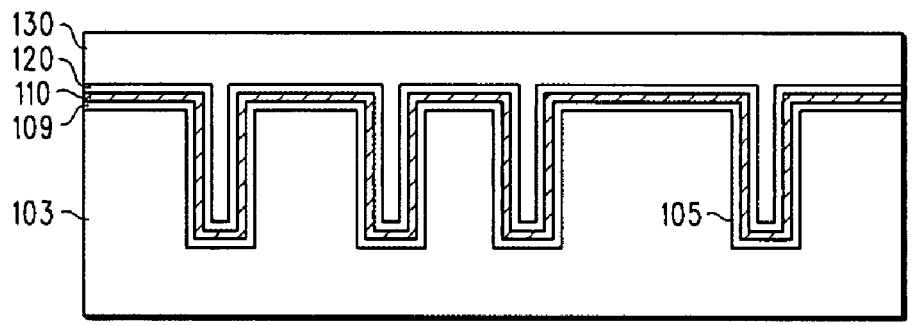
FIG. 4 is an illustration of a step in a prior art process for making a via in a semiconductor layer.
Figure 5:
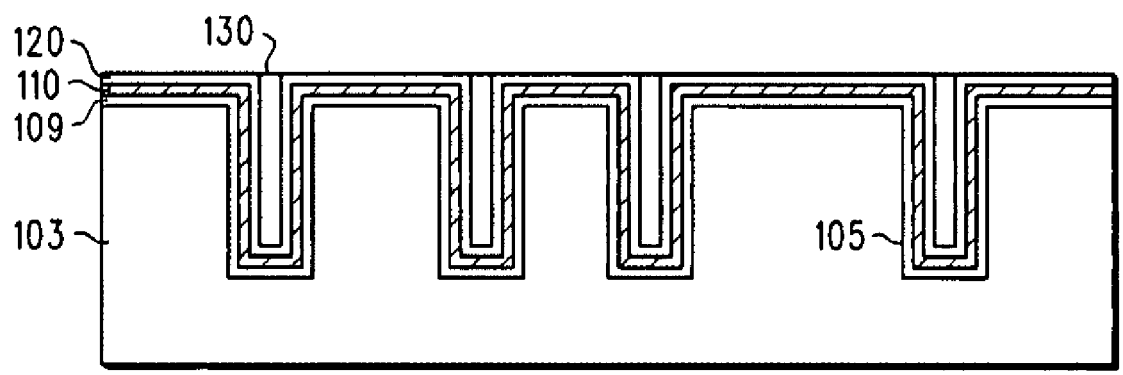
FIG. 5 is an illustration of a step in a prior art process for making a via in a semiconductor layer.

As shown in FIG. 3, a metal seed layer 120 is then deposited over the barrier layer 110. The vias 105 are then filled through electroplating to form interconnects as shown in FIG. 4, although similar methods are also known in the art in which the vias 105 may be filled by an electroless process. The structure is then subjected to CMP as shown in FIG. 5 to remove the metal overburden.

While the methodology of FIGS. 1-5 may have some desirable features, it also has some infirmities. In particular, the electroplating process utilized in this approach may result in voiding when applied to deep or wide vias. Moreover, this approach may result in a large metal overburden, especially when used to fill deep or wide vias. This overburden may impose stress on, and induce fractures in, a semiconductor substrate. Such large overburdens also typically require extended chemical mechanical polishing (CMP) for their removal.

Figure 6:
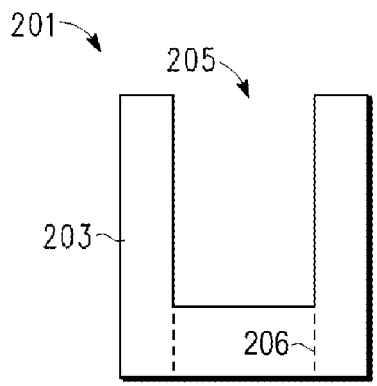
FIG. 6 is an illustration of a step in a first embodiment of a process for making a via in a semiconductor layer in accordance with the teachings herein.

FIGS. 6-13 illustrate a first particular, non-limiting embodiment of a process in accordance with the teachings herein. As shown in FIG. 6, a semiconductor structure 201 is provided which comprises a semiconductor layer 203 having a via 205 defined therein. The via 205 may be formed by a suitable masking and etching process, or through other suitable means as are known to the art, and preferably has a depth of at least 50 microns and/or a width of at least 5 microns. Although the via 205 is shown as extending only a certain distance into layer 203, in other embodiments, via 205 may extend all the way through layer 203 as indicated by the dashed lines 206. In some embodiments, via 205 extends through multiple layers such as, for example, through part or all of a wafer.

Figure 7:
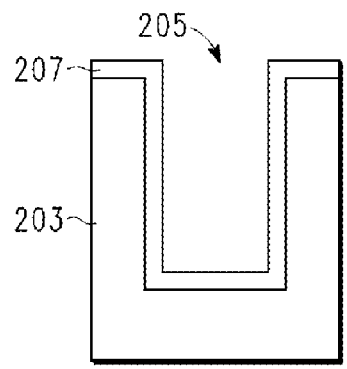
FIG. 7 is an illustration of a step in a first embodiment of a process for making a via in a semiconductor layer in accordance with the teachings herein.

With reference to FIG. 7, a conformal layer of dielectric material 207 is then deposited over the structure. The conformal layer of dielectric material 207 may comprise, for example, silicon oxide, silicon nitride, or silicon oxynitride. The dielectric layer may also be formed by plasma nitridation of the silicon substrate to form silicon nitride. Plasma nitridation may be performed in a plasma chamber with feed gases of ammonia, nitrogen, hydrogen, or combinations thereof.

Figure 8:
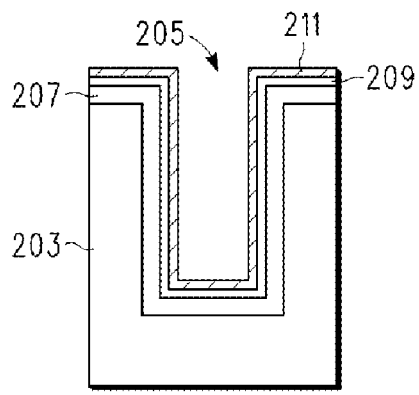
FIG. 8 is an illustration of a step in a first embodiment of a process for making a via in a semiconductor layer in accordance with the teachings herein.

A barrier layer 209 and metal seed layer 211 are then deposited over the layer of dielectric material 207 as shown in FIG. 8. Preferably, the barrier layer 209 comprises Ta or TaN, and the seed layer 211 comprises copper. However, in some embodiments, other types of seed layers may be used such as, for example, seed layers comprising Ru, Co, Ni, Ti, or various alloys thereof. In other embodiments, the barrier layer 209 may comprise a platable metal, such as Co, Ni, Ru, or various alloys thereof, and in such embodiments, there may be no need to deposit a separate seed layer, since the via fill may be electrolessly deposited directly on the platable metal or alloy.

Figure 9:
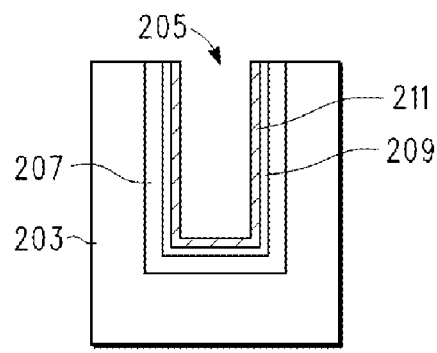
FIG. 9 is an illustration of a step in a first embodiment of a process for making a via in a semiconductor layer in accordance with the teachings herein.
Figure 10:
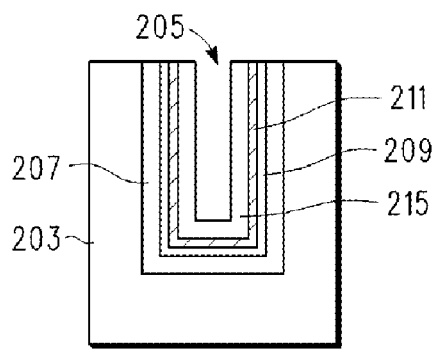
FIG. 10 is an illustration of a step in a first embodiment of a process for making a via in a semiconductor layer in accordance with the teachings herein.

As shown in FIG. 9, the structure is then subjected to a planrization process such as CMP to remove a portion of the seed layer 211 and barrier layer 209 such that the remaining portions of these layers are confined to the surfaces of the via 205. Layer 203 is used as a planarization stop in this process. An electroless process is then utilized to deposit a layer of metal 215 over the seed layer 211, as shown in FIG. 10. Preferably, the layer of metal 215 comprises copper, although it may also comprise other electroless plated metals, such as Co, Ni, Au, or Ru. Since the seed layer 211 is present only within the via 205, the layer of metal 215 likewise only grows within the via 205.

Figure 11:
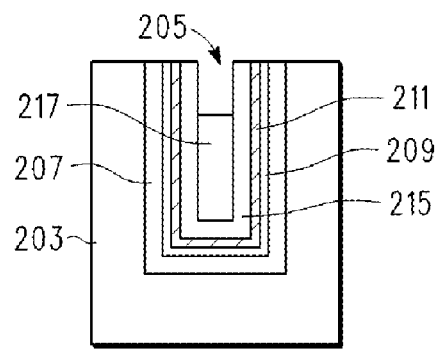
FIG. 11 is an illustration of a step in a first embodiment of a process for making a via in a semiconductor layer in accordance with the teachings herein.

Referring now to FIG. 11, the remaining space within the via is filled with a dielectric material 217. This dielectric material 217 may comprise silicon oxide, silicon nitride, silicon oxynitride, flowable glass, various low-k materials, or combinations thereof. The dielectric material 217 may be deposited in a spin-on or plasma enhanced chemical vapor deposition (PECVD) process.

The dielectric material 217 is then subjected to an optional CMP and blanket etch back so that it is recessed with respect to the surface of the semiconductor layer 203. This etch back may be accomplished with a suitable dry reactive ion etch (RIE) process or a wet etch process. The RIE etch chemistry may comprise $CF_4$, $C_2F_6$, $C_3F_8$, $C_4F_8$, $C_5F_8$, $C_4F_6$, HF, $NF_3$, $SF_6$, Ar, $O_2$, or various combinations or subcombinations thereof. Suitable wet etch chemistries include those based on HF, $H_2O_2$, nitric acid, buffered oxide etch chemistry, or various combinations or subcombinations thereof. In some embodiments, a conductive epoxy may be substituted for the dielectric material 217.

Figure 12:
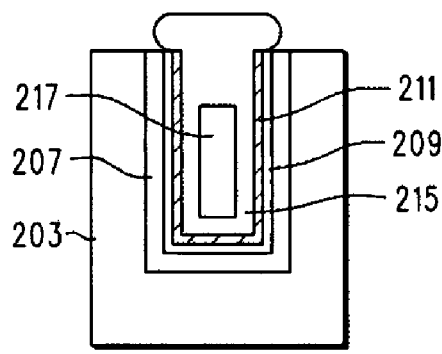
FIG. 12 is an illustration of a step in a first embodiment of a process for making a via in a semiconductor layer in accordance with the teachings herein.
Figure 13:
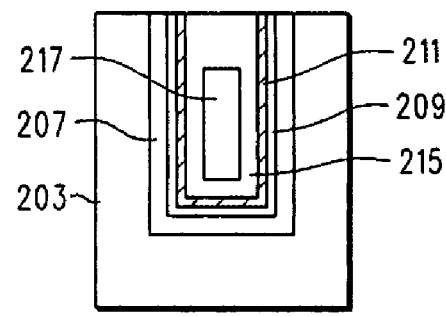
FIG. 13 is an illustration of a step in a first embodiment of a process for making a via in a semiconductor layer in accordance with the teachings herein.

As shown in FIG. 12, the structure is then subjected again to an electroless metal deposition, which causes the layer of metal 215 to grow around the dielectric material 217. This additional metal deposition preferably utilizes the same metal as the original metal deposition. However, in some embodiments, a different metal (which may be any of the metals which may be used in the first metal deposition) may be utilized. Due to the isotropic nature of the electroless deposition process, this process may result in formation of a localized overburden or "mushrooming" of the metal layer 215 above the surface of the semiconductor layer 203. This overburden may be removed by CMP to achieve a planarized surface, as shown in FIG. 13.

Figure 14:
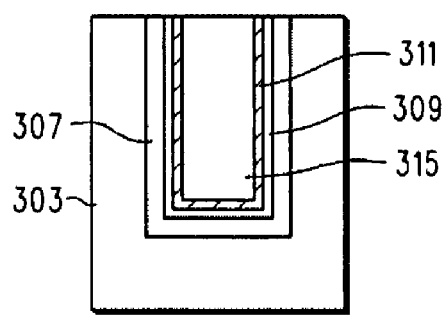
FIG. 14 is an illustration of a step in a second embodiment of a process for making a via in a semiconductor layer in accordance with the teachings herein.

FIG. 14 illustrates a second particular, non-limiting embodiment of a process in accordance with the teachings herein. This embodiment is particularly useful for TSVs with small critical dimensions.

Beginning with a structure similar to that shown in FIG. 9, the structure is subjected to an electroless metal deposition, which causes the layer of metal 315 to grow such that it fills the via. As in the previous embodiment, due to the isotropic nature of the electroless deposition process, this may result in formation of an overburden above the surface of the semiconductor layer 303. The overburden is then removed through CMP to achieve a planarized surface as shown in FIG. 14.

Figure 15:
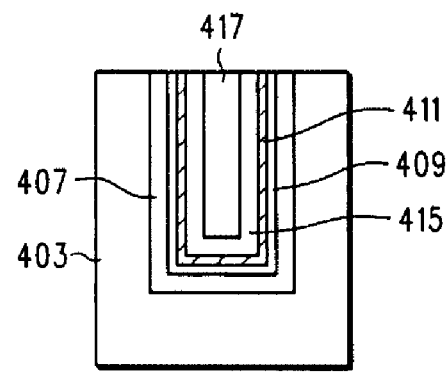
FIG. 15 is an illustration of a step in a third embodiment of a process for making a via in a semiconductor layer in accordance with the teachings herein.
Figure 16:
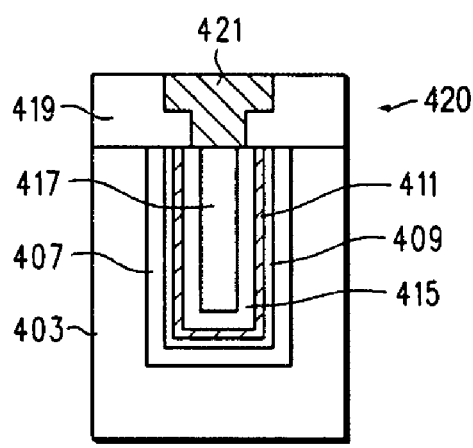
FIG. 16 is an illustration of a step in a third embodiment of a process for making a via in a semiconductor layer in accordance with the teachings herein.

FIG. 15 illustrates a third particular, non-limiting embodiment of a process in accordance with the teachings herein. Beginning with a structure similar to that shown in FIG. 9, the via is filled with a dielectric material 417, and the dielectric material 417 is subjected to a blanket etch back or dielectric CMP so that it is essentially even with the surface of the semiconductor layer 403. Then, as shown in FIG. 16, a landing pad 420 is formed over the dielectric material 417 and the metal layer 415. The landing pad 420 comprises a dielectric material 419 and a portion of metal interconnect 421. The landing pad 420 may be formed by depositing the dielectric material 419 as a layer over the semiconductor layer 403, using a masking and etching process to define an opening in the dielectric layer 419 which exposes the underlying metal layer 415, electrolessly growing the metal interconnect 421 from the metal layer 415, and subjecting the structure to CMP to achieve a planarized surface. Alternatively, after defining the opening in the dielectric layer 419, a barrier layer and metal seed layer can be deposited, followed by electroplating of a suitable metal and CMP of the overburden.

It will be appreciated that, in the foregoing embodiments (and in contrast to the prior art process depicted in FIGS. 1-5), the metal overburden attendant to the deposition process is reduced or eliminated through removal of the metal seed layer overlying the substrate adjacent to the via. This reduces the amount of stress which the substrate is subjected to, and also reduced the amount of subsequent processing required.

Various commercially available electroless metal plating chemistries and methodologies may be utilized within the context of the methodologies described herein. These include, for example, the ENTHONE ECu 57™ electroless copper plating bath solution (available commercially from Enthone, Inc., West Haven, Conn.) and Circuposit™ electroless copper chemistry from Rohm & Haas. The pH of the solution is adjusted to the range of 11-13 prior to plating, and deposition is preferably carried out within the temperature range of 70-80° C. When a copper seed layer is used, no activation chemistry is required.

If a CMP process is utilized to remove a portion of the metal seed layer from the surface of the substrate, a mild cleaning process may be used to clean the metal within the via. In one exemplary, non-limiting embodiment, the cleaning solution comprises a mixture of malic acid (10-100 g/L, and preferably 20 g/L), citric acid (10-100 g/L, and preferably 20 g/lit), a non-ionic surfactant (20 ppm), and ammonium persulfate (10-100 g/L, and preferably 20 g/L). The process time is about 2-3 minutes, and the temperature is ambient.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for forming an interconnect, comprising:
   providing a substrate with a via defined therein;
   forming a conformal dielectric layer over the surfaces of the via;
   forming a barrier layer over the dielectric layer;
   forming a seed layer over the barrier layer such that a first portion of the seed layer extends over a surface of the via, and a second portion of the seed layer extends over a portion of the substrate;
   removing the second portion of the seed layer; and
   depositing, by an electroless process, a first metal over the first portion of the seed layer after second portion of the seed layer is removed.

2. The method of claim 1, wherein the second portion of the seed layer is removed by chemical mechanical polishing (CMP).

3. The method of claim 1, wherein the via extends through the substrate.

4. The method of claim 1, wherein the via extends partially through the substrate from a first surface thereof and wherein, after the first portion of the first metal is deposited, the second surface of the substrate is subjected to CMP until the first metal is exposed.

5. The method of claim 1, wherein the step of depositing a first metal over the first portion of the seed layer results in the formation of an interconnect.

6. The method of claim 1, wherein:
   a first portion of the barrier layer is disposed over a surface of the via and a second portion of the barrier layer extends over a portion of the substrate, and further comprising removing the second portion of the barrier layer by planarization.

7. The method of claim 1, wherein the first metal is deposited over the first portion of the seed layer until the opening is filled with the metal.

8. The method of claim 1, wherein the step of depositing the first metal over the first portion of the seed layer includes:
   depositing the first metal over the first portion of the seed layer such that the opening is partially filled with the first metal; and
   depositing a second metal over the first metal.

9. The method of claim 8, wherein the second metal is deposited over the first metal until the opening is filled.

10. The method of claim 1, wherein the step of depositing the first metal over the first portion of the seed layer only partially fills the via, and further comprising depositing a dielectric material in the via.

11. The method of claim 10 wherein, after the dielectric material is deposited, the dielectric material is encapsulated by depositing an additional portion of the first metal.

12. The method of claim 11, wherein the dielectric material is subjected to an etch back prior to depositing an additional portion of the first metal.

13. The method of claim 1, wherein the step of depositing the first metal over the first portion of the seed layer only partially fills the via, and further comprising depositing a conductive epoxy in the via.

14. The method of claim 1, wherein the first portion of the first metal extends above the surface of the substrate, and wherein the resulting structure is subjected to planarization.

15. The method of claim 1, wherein the via has a depth of at least 50 microns.

16. The method of claim 1, wherein the via has a width of at least 5 microns.

17. The method of claim 1, wherein the conformal dielectric layer is formed by plasma nitridation of the substrate.

18. The method of claim 1, wherein the seed layer is a platable barrier layer.

19. The method of claim 18, wherein the barrier layer comprises a metal selected from the group consisting of Co, Ni and Ru.

* * * * *